United States Patent
Kojima

(10) Patent No.: US 7,670,753 B2
(45) Date of Patent: Mar. 2, 2010

(54) LITHOGRAPHIC PRINTING PLATE PRECURSOR

(75) Inventor: Yasuhiko Kojima, Saitama-ken (JP)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/573,733

(22) PCT Filed: Aug. 17, 2005

(86) PCT No.: PCT/US2005/029430

§ 371 (c)(1),
(2), (4) Date: Feb. 15, 2007

(87) PCT Pub. No.: WO2006/023667

PCT Pub. Date: Mar. 2, 2006

(65) Prior Publication Data

US 2008/0261146 A1    Oct. 23, 2008

(30) Foreign Application Priority Data

Aug. 23, 2004   (JP) .............................. 2004-242968

(51) Int. Cl.
*G03F 7/00* (2006.01)
*G03C 1/00* (2006.01)
(52) U.S. Cl. ..................................... 430/302; 403/270.1
(58) Field of Classification Search ............... 430/270.1
See application file for complete search history.

(56) References Cited

U.S. PATENT DOCUMENTS

| 6,294,311 | B1 * | 9/2001 | Shimazu et al. | 430/271.1 |
| 6,458,507 | B1 | 10/2002 | Burberry et al. | |
| 2004/0197701 | A1 * | 10/2004 | Mitsumoto et al. | 430/270.1 |
| 2009/0022961 | A1 * | 1/2009 | Strehmel et al. | 428/195.1 |

FOREIGN PATENT DOCUMENTS

| EP | 1 142 707 | 10/2001 |
| EP | 1 445 120 | 8/2004 |

OTHER PUBLICATIONS

Burnett et al. Maleic Anhydride, Maleic Acid, and Fumnaric Acid. Hutsman Petrochemical Corpoation, submitted on Apr. 26, 2001. http://jws-edck.interscie4nce.wiley.com:8095/kirk_articles_fs.html.*

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

To provide a lithographic printing plate precursor which generates no stains in the non-image area and is also excellent in development latitude. Disclosed is a lithographic printing plate precursor comprising a support and a photosensitive layer, said lithographic printing plate precursor further comprising a subbing layer containing a maleamic acid (co)polymer, in which at least one hydrogen atom on a nitrogen atom is substituted with an onium group, provided between the photosensitive layer and the support.

18 Claims, No Drawings

LITHOGRAPHIC PRINTING PLATE PRECURSOR

TECHNICAL FIELD

The present invention relates to a lithographic printing plate precursor and, more particularly, to a negative or positive type lithographic printing plate precursor which has a wide development latitude and, also, generates no stains in the non-image area.

BACKGROUND ART

With the progress of computer image processing techniques, a method of directly writing images on a photosensitive layer by light irradiation in response to digital signals has recently been developed and, thus, intense interest has been shown toward a computer-to-plate (CTP) system in which images are directly formed on a photosensitive lithographic printing plate, without outputting them onto a silver salt mask film, by employing the method in a lithographic printing plate precursor. The CTP system, which uses a high-output laser having a maximum intensity within the near infrared or the infrared range as a light source for light irradiation, has the following advantages: images having high resolution can be obtained by exposure within a short time and the photosensitive lithographic printing plate used in the system can be handled in a daylight room. Regarding solid and semiconductor lasers capable of emitting infrared ray having a wavelength of 760 to 1200 nm, high-output and portable lasers readily available.

As a positive type photosensitive lithographic printing plate material for a CTP system, for example, a printing plate material obtained by adding a photothermal conversion material and a quinonediazide compound to an alkali soluble resin is known. In the image area of the positive type lithographic printing plate, the quinonediazide compound functions as a dissolution inhibitor which substantially decreases the alkali solubility of the alkali soluble resin. In the non-image area, the quinonediazide compound is decomposed by heat to lose the dissolution inhibiting capability, and thus the alkali soluble resin is removed by an alkali developer to form an image.

As a negative type photosensitive lithographic printing plate for CTP system, there is known a printing plate in which, by introducing a substance which generates an acid due to light or heat into a photosensitive layer, the condensation crosslinking reaction is caused by a heat treatment after exposure using the acid generated on exposure as a catalyst, and the photosensitive layer of the exposed area is cured to form an image. There is also known a printing plate in which, by introducing a substance which generates a radical due to light or heat into a photosensitive layer, a polymerization reaction is caused using the acid generated on exposure as a catalyst, and the photosensitive layer of the exposed portion is cured to form an image.

Regarding the support used in such a lithographic printing plate precursor, intensive research has hitherto been done into making the surface of the support hydrophilic so as to prevent stains in the non-image area. For example, when a metal support such as aluminum plate is used as a substrate, various techniques such as anodizing of aluminum substrate, or silicate treatment of an anodized aluminum substrate for further improving hydrophilicity have been proposed.

However, various treatments for improving hydrophilicity are not always excellent in affinity to the photosensitive layer. There has also been a problem that, in some cases, adhesion between the support and the photosensitive layer formed thereon is impaired so that the photosensitive layer is peeled under severe printing conditions and sufficient printing durability cannot be obtained.

Thus, there was suggested a method in which various subbing layers are formed between the support and the photosensitive layer so as to improve adhesion between the hydrophilized support surface and the photosensitive layer. When a material having a functional group which is excellent in affinity to a resin material constituting the photosensitive layer or the support surface is used as the subbing layer, adhesion in the image area is improved and a sufficient printing durability can be obtained.

However, in the non-image area, the photosensitive layer is not completely removed on development, and remains the layer on the support surface, thereby to cause a problem that adhesion of ink onto the remaining layer causes stains in the non-image area. Therefore, it has been desired to develop a lithographic printing plate precursor which has excellent surface hydrophilicity and also satisfies both excellent adhesion to a photosensitive layer in the image area and excellent removability of the photosensitive layer in the non-image area.

As the lithographic printing plate precursor, there is proposed a lithographic printing plate precursor provided with an intermediate layer comprising a polymer containing a monomer having an acid group and a monomer having an onium group (see Patent Document 1). This lithographic printing plate precursor improves adhesion of a support and a photosensitive layer, thereby to further improve printing durability and to suppress generation of stains in the non-image area. However, it has been desired to further decrease the generation of stains in the non-image area and to improve development latitude.

[Patent Document 1] Japanese Unexamined Patent Publication (Kokai) No. 2000-108538

DISCLOSURE OF THE INVENTION

Problems to be Solved by the Invention

An object of the present invention is to provide a lithographic printing plate precursor which generates no stains in the non-image area and is also excellent in development latitude.

Means for Solving the Problems

The object of the present invention is achieved by a lithographic printing plate precursor comprising a support and a photosensitive layer, said lithographic printing plate precursor further comprising a subbing layer containing a maleamic acid (co)polymer, in which at least one hydrogen atom on a nitrogen atom is substituted with an onium group, provided between the photosensitive layer and the support.

The maleamic acid (co)polymer, in which at least one hydrogen atom on a nitrogen atom is substituted with an onium group, preferably contains a unit of the following formula:

[Chemical Formula 1]

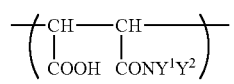

[wherein
Y$^1$ represents an onium group of the formula (1):

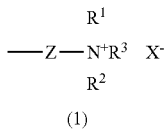

(1)

(wherein
R$^1$ and R$^2$ each independently represents a C$_1$-C$_4$ alkyl group;
R$^3$ represents a hydrogen atom or a C$_1$-C$_4$ alkyl group;
X$^-$ represents a counter anion; and
z represents a divalent organic group), and
Y$^2$ represents a hydrogen atom or the onium group of the formula (1)].

The maleamic acid (co)polymer, in which at least one hydrogen atom on a nitrogen atom is substituted with an onium group, is preferably obtained by a first step of reacting a maleic anhydride (co)polymer with an N,N-dialkylamino group-containing amine to obtain a maleamic acid (co)polymer, and the second step of reacting the maleamic acid copolymer with an alkyl halide, an alkyl sulfonate ester or an acid compound. The first and second steps may be successively or simultaneously conducted in the same vessel. The N,N-dialkylamino group-containing amine is preferably N,N-di C$_1$-C$_4$ alkylamino C$_1$-C$_4$ alkylamine.

The maleic anhydride (co)polymer is preferably a copolymer obtained by copolymerizing maleic anhydride with at least one vinyl-based monomer selected from the group consisting of ethylene, propylene, styrene, α-methylstyrene, and acrylonitrile.

EFFECT OF THE INVENTION

According to the present invention, there can be provided a lithographic printing plate precursor capable of directly making a printing plate by exposure based on digital signals, which generates no stains in the non-image area and is also excellent in development latitude.

BEST MODE FOR CARRYING OUT THE INVENTION

The lithographic printing plate precursor of the present invention comprises a support and a photosensitive layer, said lithographic printing plate precursor further comprising a subbing layer containing a maleamic acid (co)polymer, in which at least one hydrogen atom on a nitrogen atom is substituted with an onium group, provided between the photosensitive layer and the support. The lithographic printing plate precursor of the present invention will now be described in detail.

<Subbing Layer>

The subbing layer of the lithographic printing plate precursor of the present invention is a characteristic portion of the present invention and is not specifically limited as far as it contains a maleamic acid (co)polymer in which at least one hydrogen atom on a nitrogen atom is substituted with an onium group. The content of the copolymer in the subbing layer is preferably 50% by mass or more, more preferably 70% by mass or more, still more preferably 90% by mass or more, and particularly preferably 100% by mass.

The onium group is preferably an onium group in which an atom having positive charge in the onium group is selected from among a nitrogen atom, a phosphorus atom and a sulfur atom, and is particularly preferably an onium group in which an atom having positive charge is a nitrogen atom.

The maleamic acid (co)polymer, in which at least one hydrogen atom on a nitrogen atom is substituted with an onium group, has a structure that a carboxyl group and a carbamoyl group are bonded to two adjacent carbon atoms in the main chain, and the atom having positive charge in the onium group may be directly bonded to a nitrogen atom constituting the carbamoyl group, or may be indirectly bonded via a divalent organic group.

The maleamic acid (co)polymer, in which at least one hydrogen atom on a nitrogen atom is substituted with an onium group, preferably contains a unit of the following general formula:

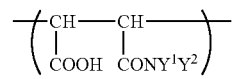

[wherein
Y$^1$ represents an onium group of the formula (1):

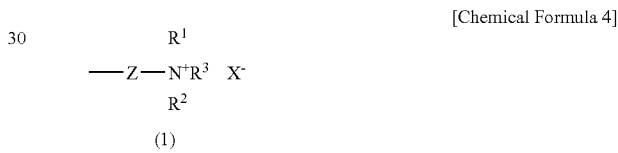

(1)

(wherein,
R$^1$ and R$^2$ each independently represents a C$_1$-C$_4$ alkyl group;
R$^3$ represents a hydrogen atom or a C$_1$-C$_4$ alkyl group;
X$^-$ represents a counter anion; and
z represents divalent organic group), and
Y$^2$ represents a hydrogen atom or an onium group of the formula (1)]. The number of repeating units is typically within a range from 1 to 1,000,000.

Examples of the divalent organic group include an aliphatic group, an aromatic group, an alicyclic group, a heterocyclic group, and an arom-aliphatic group, and an aliphatic group is preferable. The aliphatic group is particularly preferably an alkylene group, and the alkylene group is preferably a C$_1$-C$_{10}$ alkylene group, more preferably a C$_1$-C$_6$ alkylene group, and particularly preferably a C$_1$-C$_4$ alkylene group. If necessary, the alkylene group may be substituted with one or more halogen atoms such as fluorine, chlorine, bromine, and iodine atoms, and one or more substituents such as a C$_1$-C$_4$ alkyl group, an amino group, a mono C$_1$-C$_4$ alkyl-substituted amino group, and a di C$_1$-C$_4$ alkyl-substituted amino group.

The maleamic acid (co)polymer, in which at least one hydrogen atom on a nitrogen atom is substituted with an onium group, is preferably prepared, for example, by successively or simultaneously conducted the first step of reacting a maleic anhydride (co)polymer with an N,N-dialkylamino group-containing amine to obtain a maleamic acid (co)polymer, and the second step of reacting the maleamic acid (co) polymer with an alkyl halide, an alkyl sulfonate ester or an acids compound in the same vessel.

In the first step, a maleamic acid (co)polymer, in which a carboxyl group and an N-substituted carbamoyl group are bonded to two adjacent carbon atoms in the main chain, is produced by the reaction represented by the following formula:

[Chemical Formula 5]

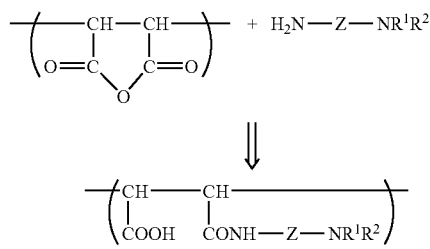

(wherein $R^1$, $R^2$ and Z are as defined above). The reaction temperature of the first step is from 20 to 150° C., preferably from 40 to 100° C., and more preferably from 60 to 80° C. The reaction solvent is not preferably an aqueous solvent such as water, and is preferably an organic solvent such as acetamide, dimethylacetamide, or diethylacetamide. The resulting maleamic acid (co)polymer is slightly insoluble in water or an organic solvent such as ethyl acetate.

In the second step, when an alkyl halide is used, an N-substituted carbamoyl group is converted into an N-onium-substituted carbamoyl group by the reaction represented by the following formula:

[Chemical Formula 6]

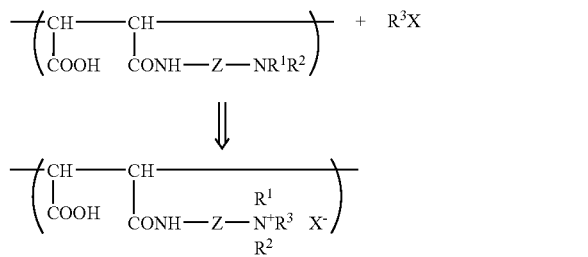

(wherein $R^1$, $R^2$, $R^3$, X and Z are as defined above). The reaction temperature of the second step is from 20 to 150° C., preferably from 60 to 120° C., and more preferably from 80 to 110° C. The reaction solvent is preferably an organic solvent such as acetamide, dimethylacetamide, or diethylacetamide. The maleamic acid (co)polymer, in which at least one hydrogen atom on a nitrogen atom is substituted with an onium group, obtained by this reaction is slightly soluble in an organic solvent such as ethyl acetate, but is soluble in a water.

As the N,N-dialkylamino group-containing amine, N,N-di $C_1$-$C_4$ alkylamino $C_1$-$C_4$ alkylamine can be preferably used. As the N,N-di $C_1$-$C_4$ alkylamino $C_1$-$C_4$ alkylamine, for example, there can be used N,N-dimethylaminomethylamine, N,N-dimethylaminoethylamine, N,N-dimethylaminopropylamine, N,N-dimethylaminobutylamine, N,N-diethylaminomethylamine, N,N-diethylaminoethylamine, N,N-diethylaminopropylamine, N,N-diethylaminobutylamine, N,N-dipropylaminomethylamine, N,N-dipropylaminoethylamine, N,N-dipropylaminopropylamine, N,N-dipropylaminobutylamine, N,N-dibutylaminomethylamine, N,N-dibutylaminoethylamine, N,N-dibutylaminopropylamine, N,N-dibutylaminobutylamine, N,N-methylethylaminomethylamine, N,N-methylpropylaminomethylamine, N,N-methylbutylaminomethylamine, N,N-ethylpropylaminomethylamine, N,N-ethylbutylaminomethylamine, N,N-propylbutylaminomethylamine, N,N-methylethylaminoethylamine, N,N-methylpropylaminoethylamine, N,N-methylbutylaminoethylamine, N,N-ethylpropylaminoethylamine, N,N-ethylbutylaminoethylamine, N,N-propylbutylaminoethylamine, N,N-methylethylaminopropylamine, N,N-methylpropylaminopropylamine, N,N-methylbutylaminopropylamine, N,N-ethylpropylaminopropylamine, N,N-ethylbutylaminopropylamine, N,N-propylbutylaminopropylamine, N,N-methylethylaminobutylamine, N,N-methylpropylaminobutylamine, N,N-methylbutylaminobutylamine, N,N-ethylpropylaminobutylamine, N,N-ethylbutylaminobutylamine, N,N-propylbutylaminobutylamine, 1-(N,N-dimethylamino)-2-propylamine, 2-(N,N-dimethylamino)-1-propylamine, 1-(N,N-dimethylamino)-2-butylamine, 2-(N,N-dimethylamino)-1-butyl amine, 1-(N,N-dimethylamino)-2-t-butylamine, 2-(N,N-dimethylamino)-1-t-butylamine, 1-(N,N-dimethylamino)-5-pentylamine, 1-(N,N-dimethylamino)-6-hexylamine, 1-(N,N-dimethylamino)-7-heptylamine, 1-(N,N-dimethylamino)-8-octylamine, 1-(N,N-dimethylamino)-9-nonylamine, 1-(N,N-dimethylamino)-10-decanylamine, 1-(N,N-dimethylamino)-12-dodecanylamine, 4-(N,N-dimethylamino)-benzoic amine, 4-(N,N-dimethylamino)-benzylamine, 4-(N,N-dimethylamino)-2-aminotoluene, 6-(N,N-dimethylamino)-2-aminotoluene, 4-(N,N-dimethylaminomethyl)-2,6-dimethylxylylamine, 1-(N,N-dimethylamino)-5-aminonaphthalene, 1-(N,N-dimethylamino)-8-aminonaphthalene, 4-amino-4'-(N,N-dimethylamino)-stilbene, 3-(N,N-dimethylamino)-cyclohexylamine, 4-(N,N-dimethylamino)-cyclohexylamine, 2-(N,N-dimethylaminomethyl)-cyclopentylamine, and 3-(N,N-dimethylaminomethyl)-cyclopentylamine.

As the alkyl halide, a $C_1$-$C_4$ alkyl halide can be preferably used. Examples thereof include methyl chloride, ethyl chloride, propyl chloride, butyl chloride, methyl bromide, ethyl bromide, propyl bromide, butyl bromide, methyl iodide, ethyl iodide, propyl iodide, and butyl iodide.

In the second step, an alkyl phosphonate ester or an acids compound can be used in place of the alkyl halide.

As the alkyl sulfonate ester, a sulfonate ester of an alkyl group having 1 to 3 carbon atoms can be used. As the acid compound, sulfuric acid, hydrochloric acid, nitric acid, fluoroboric acid, and alkylsulfuric acid having 1 to 3 carbon atoms can be used.

The maleic anhydride (co)polymer may be a homopolymer of maleic anhydride, but is preferably a copolymer of maleic anhydride and a monomer, which is radically polymerizable with maleic anhydride, particularly at least one ethylenically unsaturated monomer.

Examples of the monomer, which is radically polymerizable with the maleic anhydride, include:
(1) (meth)acrylamide having a hydroxyl group, such as N-(4-hydroxyphenyl)acrylamide or N-(4-hydroxyphenyl)methacrylamide;
(2) hydroxystyrene such as o-, m- or p-hydroxystyrene, o- or m-bromo-p-hydroxystyrene, or o- or m-chloro-p-hydroxystyrene;

(3) (meth)acrylate having an aromatic hydroxy group, such as o-, m- or p-hydroxyphenyl acrylate or methacrylate;
(4) acrylamide such as N-(o-aminosulfonylphenyl)acrylamide, N-(m-aminosulfonylphenyl)acrylamide, N-(p-aminosulfonylphenyl)acrylamide, N-[1-(3-aminosulfonyl)naphthyl]acrylamide, or N-(2-aminosulfonylethyl)acrylamide;
(5) methacrylamide such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, or N-(2-aminosulfonylethyl)methacrylamide;
(6) acrylic acid ester such as o-aminosulfonylphenyl acrylate, m-aminosulfonylphenyl acrylate, p-aminosulfonylphenyl acrylate, or 1-(3-aminosulfonylphenylnaphthyl)acrylate;
(7) methacrylic acid ester such as o-aminosulfonylphenyl methacrylate, m-aminosulfonylphenyl methacrylate, p-aminosulfonylphenyl methacrylate, or 1-(3-aminosulfonylphenylnaphthyl)methacrylate;
(8) (meth)acrylate having an aliphatic hydroxy group, such as 2-hydroxyethyl acrylate or 2-hydroxyethyl methacrylate;
(9) (substituted)acrylic acid esters such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate;
(10) (substituted)methacrylic acid esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate;
(11) (meth)acrylamide such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylacrylamide, N-phenylacrylamide, N-phenylmethacrylamide, N-benzylacrylamide, N-benzylmethacrylamide, N-nitrophenylacrylamide, N-nitrophenylmethacrylamide, or N-ethyl-N-phenylacrylamide and N-ethyl-N-phenylmethacrylamide;
(12) vinyl ether such as ethyl vinyl ether, 2-chloroethyl vinyl ether, hydroxyethyl vinyl ether, propyl vinyl ether, butyl vinyl ether, octyl vinyl ether, or phenyl vinyl ether;
(13) vinyl ester such as vinyl acetate, vinyl chloroacetate, vinyl butyrate, or vinyl benzoate;
(14) styrene derivative such as styrene, α-methylstyrene, methylstyrene, or chloromethylstyrene;
(15) vinyl ketone such as methyl vinyl ketone, ethyl vinyl ketone, propyl vinyl ketone, or phenyl vinyl ketone;
(16) olefin such as ethylene, propylene, isobutyrene, butadiene, or isoprene;
(17) N-vinyl pyrrolidone, N-vinyl carbazole, 4-vinyl pyridine, acrylonitrile, or methacrylonitrile;
(18) lactone group-containing monomer such as pantoyl lactone(meth)acrylate, α-(meth)acryloyl-γ-butyrolactone, or β-(meth)acryloyl-γ-butyrolactone; and
(19) ethylene oxide group-containing monomer such as polyethylene glycol mono(meth)acrylate, polypropylene glycol mono(meth)acrylate, or methoxypolyethylene glycol mono(meth)acrylate.

The monomer, which is radically polymerizable with maleic anhydride, is preferably ethylene, propylene, styrene, α-methylstyrene, or acrylonitrile, and particularly preferably styrene, α-methylstyrene or acrylonitrile.

As a method for preparing a maleic anhydride (co)polymer, known methods, such as suspension polymerization and solution polymerization methods, can be used. When the maleic anhydride (co)polymer is a copolymer, it may be any one of a block copolymer, a random copolymer, and a graft copolymer. A commercially available product can also be used as the maleic anhydride copolymer and examples of the commercially available maleic anhydride copolymer include maleic anhydride copolymer RX and GSM series manufactured by Gifu Shellac Mfg., Co., Ltd.

When using a copolymer of maleic anhydride and a monomer, which is radically polymerizable with maleic anhydride, is used, the content of the maleic anhydride in the entire monomer is preferably 1% by mol or more, more preferably 5% by mol or more, more preferably 15% by mol or more, more preferably 20% by mol or more, more preferably 25% by mol or more, more preferably 30% by mol or more, more preferably 35% by mol or more, more preferably 40% by mol or more, more preferably 45% by mol or more, and particularly preferably 50% by mol or more.

The weight-average molecular weight of the maleamic acid (co)polymer, in which at least one hydrogen atom on a nitrogen atom is substituted with an onium group, is preferably from 500 to 1,000,000, and more preferably from 1,000 to 500,000.

The subbing layer can be formed on a support described hereinafter by various methods. Examples of the typical method for forming the subbing layer include:
(1) a method of applying a solution prepared by dissolving a maleamic acid (co)polymer, in which at least one hydrogen atom on a nitrogen atom is substituted with an onium group, in an organic solvent such as methanol, ethanol, or methyl ethyl ketone, or a solvent mixture thereof, or a solvent mixture of these organic solvents and water on a support, followed by drying to form a subbing layer, and
(2) a method of dipping a support in a solution prepared by dissolving a maleamic acid (co)polymer, in which at least one hydrogen atom on a nitrogen atom is substituted with an onium group, in an organic solvent such as methanol, ethanol, or methyl ethyl ketone, or a solvent mixture thereof, or a solvent mixture of these organic solvents and water, and washing the support with water or air, followed by drying to form a subbing layer.

In the method (1), a (co)polymer solution having a concentration of 0.005 to 10% by mass may be applied by various methods. The coating method may be any method including bar coater coating, spin coating, spray coating, and curtain coating. In the method (2), the concentration of the solution is from 0.005 to 20% by mass, and preferably from 0.01 to 10% by mass, and the dipping temperature is from 0 to 70° C., and preferably from 5 to 60° C. The dipping time is from 0.1 seconds to 5 minutes, and preferably from 0.5 to 120 seconds.

The pH of the above-mentioned solution can be adjusted with a basic substance such as ammonia, triethylamine or potassium hydroxide; an inorganic acid such as hydrochloric acid, phosphoric acid, sulfuric acid, or nitric acid; an organic sulfonic acid such as nitrobenzenesulfonic acid or naphthalenesulfonic acid; an organic phosphonic acid such as phenylphosphonic acid; an organic carboxylic acid such as benzoic acid, coumaric acid or malic acid; and an organic chloride such as naphthalenesulfonyl chloride or benzenesulfonyl chloride, so that the solution can be used within the range of pH =0 to 12, preferably pH =0 to 6. A substance which absorbs ultraviolet ray, visible ray or infrared ray can be added to the solution so as to improve tone reproducibility of the photosensitive lithographic printing plate.

In the invention, the total amount of the applied subbing layer after drying is properly from 1 to 100 mg/m$^2$, preferably from 1.5 to 70 mg/m$^2$.

<Photosensitive Layer>

The photosensitive layer used in the invention is not specifically limited and various known photosensitive layers for lithographic printing plate precursor can be used. Typical examples thereof include photosensitive layers such as photosensitive layers and thermosensitive layers, and preferred examples thereof include conventional positive type, conventional negative type, photopolymer type, thermal positive type, thermal negative type, and non-treated type photosensitive layers. These preferred photosensitive layers will now be described.

(Conventional Positive Type)

A conventional positive type photosensitive layer is preferably made of a photosensitive composition containing an o-quinonediazide compound and an alkali soluble polymer compound.

Examples of the o-quinoneazide compound include esters of 1,2-naphthoquinone-2-diazide-5-sulfonylchloride with a phenol/formaldehyde resin or a cresol/formaldehyde resin, and esters of 1,2-naphthoquinone-2-diazide-5-sulfonylchloride with a pyrogallol/acetone resin described in U.S. Pat. No. 3,635,709.

Examples of the alkali soluble polymer compound include a phenol/formaldehyde resin, a cresol/formaldehyde resin, a phenol/cresol/formaldehyde copolycondensation resin, polyhydroxystyrene, an N-(4-hydroxyphenyl)methacrylamide copolymer, and a carboxy group-containing polymer described in Japanese Unexamined Patent Publication (Kokai) No. 7-36184. Various alkali soluble polymer compounds, such as acrylic resin which contains a phenolic hydroxyl group as described in Japanese Unexamined Patent Publication (Kokai) No. 51-34711, and acrylic resin or urethane resin which has a sulfonamide group as described in Japanese Unexamined Patent Publication (Kokai) No. 2-866 can also be used.

It is preferred to add, to the conventional positive type photosensitive layer, compounds such as sensitivity adjuster, printing-out agent, and dye described in paragraphs [0024] to [0027] in Japanese Unexamined Patent Publication (Kokai) No. 7-92660, or a surfactant for improving coatability as described in paragraph [0031] in the same publication.

(Conventional Negative Type)

A conventional negative type photosensitive layer is preferably made of a photosensitive composition containing a diazo resin and an alkali soluble or swelling polymer compound (binder).

Examples of the diazo resin include condensates of an aromatic diazonium salt and an active carbonyl group-containing compound such as formaldehyde, and organic solvent soluble diazo resin inorganic salts, which are products resulting from reaction of a condensate of a p-diazophenylamine and formaldehyde with a hexafluorophosphate or a tetrafluoroborate. A high molecular diazo compound containing at least 20% by mol of a hexamer described in Japanese Unexamined Patent Publication (Kokai) No. 59-78340 is particularly preferable.

Preferred examples of the binder include copolymers which contain acrylic acid, methacrylic acid, crotonic acid or maleic acid as an essential component. Specific examples thereof include multi-component copolymers including monomers such as 2-hydroxyethyl(meth)acrylate, (meth)acrylonitrile, and (meth)acrylic acid as described in Japanese Unexamined Patent Publication (Kokai) No. 50-118802; and multi-component polymers including alkyl acrylate, (meth)acrylonitrile, and unsaturated carboxylic acid as described in Japanese Unexamined Patent Publication (Kokai) No. 56-4144.

It is preferred to add, to the conventional negative type photosensitive layer, such compounds as a printing-out agent, a dye, a plasticizer for giving flexibility or abrasion resistance to films, a development accelerator, or a surfactant for improving the coatability described in paragraphs [0014] to [0015] in Japanese Unexamined Patent Publication (Kokai) No. 7-281425.

(Photopolymer Type)

A photopolymer type photosensitive layer is formed of a photopolymerizable photosensitive composition (referred to as a "photopolymerizable composition" hereinafter) and contains an ethylenically unsaturated bond-containing compound which is addition-polymerizable (referred to merely as an "ethylenically unsaturated bond-containing compound" hereinafter), a photopolymerization initiator and a polymer binder as essential components and optionally contains various compounds such as colorant, plasticizer, and thermopolymerization inhibitor.

The ethylenically unsaturated bond-containing compound is a compound having an ethylenically unsaturated bond which is addition-polymerized, crosslinked and cured by an action of the photopolymerization initiator when the photopolymerizable composition is irradiated with light. The ethylenically unsaturated bond-containing compound can be arbitrarily selected from compounds having at least one terminal ethylenically unsaturated bond, preferably two or more terminal ethylenically unsaturated bonds, and takes the chemical morphology of a monomer, a prepolymer (that is, dimer, trimer, or oligomer), a mixture thereof or a copolymer thereof, or in some other chemical morphology. Examples of the monomer include an ester of an unsaturated carboxylic acid (such as acrylic acid, methacrylic acid, itaconic acid, crotonic acid, isocrotonic acid or maleic acid) with an aliphatic polyhydric alcohol compound, and an amide of an unsaturated carboxylic acid with an aliphatic polyhydric amine compound. Urethane-based addition-polymerizable compounds are also preferred.

The photopolymerization initiator can be appropriately selected from various photopolymerization initiators and combination systems of two or more photopolymerization initiators (photo initiator systems), depending on the wavelength of the light source used. For example, initiator systems described in paragraphs [0021] to [0023] in Japanese Unexamined Patent Publication (Kokai) No. 2001-22079 are preferred.

As the polymer binder, alkali water soluble or swelling organic polymers are used because the binder, which functions as an agent for forming the film of the photopolymerizable composition, must cause the dissolution of the photosensitive layer in an alkali developer. As the polymers, polymers described in Japanese Unexamined Patent Publication (Kokai) No. 2001-22079 are useful. It is also preferred to add additives (for example, a surfactant for improving coatability) disclosed in paragraphs [0079] to [0088] in the same publication to the photopolymerizable composition.

In order to prevent the polymerization inhibiting action of oxygen, it is also preferred to provide an oxygen-blocking protective layer on or over the photosensitive layer. Examples of the polymer contained in the oxygen-blocking protective layer are polyvinyl alcohol and copolymers thereof.

(Thermal Positive Type)

A thermosensitive layer of the thermal positive type contains an alkali soluble polymer compound and a photothermal conversion material. Preferred examples of the alkali soluble polymer compound include homopolymers having an acidic group in the polymers, copolymers thereof, and mixtures thereof. From the viewpoint of solubility in alkali developer, particularly preferred are polymer compounds having an acidic group as described in the following (1) or (2):

(1) phenolic hydroxy group (—Ar—OH), and
(2) sulfonamide group (—SO$_2$NH—R).

Above all, it is preferred that the polymer compounds have a phenolic hydroxyl group from the viewpoint of the superior image forming properties when exposed to an infrared laser. Specific examples thereof include novolak resins, such as phenol formaldehyde resin, m-cresol formaldehyde resin, p-cresol formaldehyde resin, m-/p-mixed cresol formaldehyde resin, and phenol/(m-, p- or m-/p-mixed) cresol mixed formaldehyde resin; and pyrogallol acetone resin. More specifically, polymers described in paragraphs [0023] to [0042] in Japanese Unexamined Patent Publication (Kokai) No. 2001-305722 and modified phenol resins described in WO02/053627 are preferably used.

The photothermal conversion material makes it possible to convert exposure energy to heat and attain an efficient interaction cancellation in the exposed area of the thermosensitive layer. From the viewpoint of recording sensitivity, a pigment or dye having a light absorption wavelength within an infrared range which corresponds to wavelengths of 700 to 1200 nm is preferred. Specific examples of the dye include azo dyes, metal complex salt azo dyes, pyrrozolone azo dyes, naphthoquinone dyes, anthraquinone dyes, phthalocyanine dyes, carbonium dyes, quinoneimine dyes, methine dyes, cyanine dyes, squarylium dyes, pyrylium dyes, and metal thiolate complexes (for example, a nickel thiolate complex). Particularly preferred are cyanine dyes, for example, cyanine dyes represented by the general formula (I) in Japanese Unexamined Patent Publication (Kokai) No. 2001-305722 can be cited. It is preferred to add, to the thermal positive type composition, the same sensitivity adjustor, printing-out agent, dye, surfactant for improving the application performance, and other compounds, similarly to the case of the above-mentioned conventional positive type. Specifically, compounds described in paragraphs [0053] to [0059] in Japanese Unexamined Patent Publication (Kokai) No. 2001-305722 are preferred.

The thermosensitive layer of the thermal positive type may have a monolayer structure, or a bilayer structure as described in Japanese Unexamined Patent Publication (Kokai) No. 11-218914.

(Thermal Negative Type)

A thermosensitive layer of the thermal negative type is a negative type thermosensitive layer, wherein, when exposed with infrared laser, the radiated areas are cured to form image areas. A preferred example of such a thermal negative type thermosensitive layer is a polymerizable type layer (hereinafter referred to as a "polymerizable layer"). The polymerizable layer contains (A) an infrared absorber, (B) a radical generator (radical polymerization initiator), (C) a radical polymerizable compound which undergoes polymerization reaction due to generated radicals so as to be cured, and (D) a binder polymer.

In the polymerizable layer, infrared light which the infrared absorber absorbs is converted to heat, and the heat generated at this time causes the radical polymerization initiator such as an onium salt to be decomposed, so as to generate radicals. The radical polymerizable compound is selected from compounds having a terminal ethylenically unsaturated bond, and undergoes a polymerization chain reaction due to the generated radicals, so that the compound is cured.

The infrared absorber (A) is, for example, the above-mentioned photothermal conversion material contained in the above-mentioned thermal positive type thermosensitive layer. Specific examples of the cyanine dye include dyes described in paragraphs [0017] to [0019] in Japanese Unexamined Patent Publication (Kokai) No. 2001-133969.

The radical generator (B) is, for example, an onium salt. Specific examples of the onium salt which is preferably used include salts described in paragraphs [0030] to [0033] in Japanese Unexamined Patent Publication (Kokai) No. 2001-133969.

The radical polymerizable compound (C) is selected from compounds having one or more (preferably two or more) terminal ethylenically unsaturated bonds.

The binder polymer (D) is preferably a linear organic polymer, and is selected from linear organic polymers soluble or swelling in water or alkalescent water. Among these polymers, (meth)acryl resins having a benzyl group or an allyl group, and a carboxyl group on the side chain are preferable because the resin is excellent in balance of film strength, sensitivity and developing property.

As the radical polymerizable compound (C) and the binder polymer (D), materials described in paragraphs [0036] to [0060] in the same publication can be used. As other additives, additives (for example, a surfactant for improving coatability) described in paragraphs [0061] to [0068] are preferably used.

A preferred example of the thermal negative type thermosensitive layer is an acid crosslinkable type layer (referred to as an "acid crosslinkable layer" hereinafter) besides the polymerizing type layer. The acid crosslinkable layer contains (E) a compound which can generate an acid due to light or heat (referred to as an "acid generator" hereinafter), and (F) a compound which can be crosslinked by the generated acid, (referred to as a "crosslinking agent"), and further contains (G) an alkali soluble polymer compound which can react with the crosslinking agent in the presence of the acid. In order to use the energy of an infrared laser effectively, the infrared absorber (A) is incorporated into the acid crosslinkable layer.

The acid generator (E) may be a compound which can be thermally decomposed to generate an acid, and examples thereof include a photo initiator for photopolymerization, a photo alterant for dyes, an acid generator used in microresists.

Examples of the crosslinking agent (F) include (i) aromatic compounds substituted with a hydroxymethyl group or an alkoxymethyl group, (ii) compounds having an N-hydroxymethyl, N-alkoxymethyl or N-acyloxymethyl group, and (iii) epoxy compounds.

Examples of the alkali soluble polymer compound (G) include novolak resin and a polymer having a hydroxyaryl group on the side chain.

(Processless Type)

A thermosensitive layer of the processless type is classified to a thermoplastic fine particle polymer type, a microcapsule type, and a sulfonic acid-generating polymer containing type. The present invention is particularly suitable for a processless type which is developed on a printing machine.

Thermoplastic Fine Particle Polymer Type

In the thermoplastic fine particle polymer type, hydrophobic heat-meltable resin fine particles (H) are dispersed in a hydrophilic polymer matrix (J). During exposure, the hydrophobic polymer is melted by heat at the exposed areas, so that the melted polymer areas are fused to each other. As a result, hydrophobic portions made of the polymer, namely, image areas are formed. The hydrophobic heat-fusable resin fine particles (H) (referred to as "polymer fine particles" hereinafter) are preferably fused and combined with each other by heat, and the particles are more preferably particles which have hydrophilic surfaces and can be dispersed in a hydrophilic component such as a dampening water.

Preferred examples of the polymer fine particles include thermoplastic polymer fine particles described in Research Disclosure No. 33303 (January in 1992), Japanese Unexamined Patent Publication (Kokai) Nos. 9-123387, 9-131850, 9-171249 and 9-171250, EP No. 931,647, etc. Specific examples thereof include homopolymers and copolymers of monomers such as ethylene, styrene, vinyl chloride, methyl acrylate, ethyl acrylate, methyl methacrylate, ethyl methacrylate, vinylidene chloride, acrylonitrile, and vinyl carbazole; and mixtures thereof. Particularly preferred are polystyrene and polymethyl methacrylate.

The polymer fine particles having hydrophilic surfaces include, as examples thereof, substances in which polymers are themselves hydrophilic, such as substances in which polymers constituting fine particles are themselves hydrophilic, or substances to which hydrophilicity is imparted by introducing hydrophilic groups into the main chains or side chains of polymers; and substances whose surfaces are made hydrophilic by allowing a hydrophilic polymer, a hydrophilic oligomer or a hydrophilic low molecular weight compound, such as polyvinyl alcohol or polyethylene glycol, to be adsorbed on the surfaces of the polymer fine particles. As the polymer fine particles, polymer fine particles having reactive functional groups are more preferred. By dispersing polymer fine particles as described above into the hydrophilic polymer matrix (J), the on-press developing properties are made better in the case of on-press development and further the film strength of the thermosensitive layer itself is also improved.

Microcapsule Type

Preferred examples of the microcapsule type include a type described in Japanese Unexamined Patent Publication (Kokai) No. 2000-118160; and a microcapsule type in which a compound having a thermally reactive functional group is encapsulated as described in Japanese Unexamined Patent Publication (Kokai) No. 2001-277740.

Sulfonic Acid-Generating Polymer Containing Type

Examples of the sulfonic acid-generating polymer include polymers having, on the side chains thereof, sulfonic acid ester groups, disulfonic groups or sec- or tert-sulfonamide groups, described in Japanese Unexamined Patent Publication (Kokai) No. 10-282672.

By incorporating a hydrophilic resin into the processless type thermosensitive layer, the on-press developing properties are improved and, further, the film strength of the thermosensitive layer itself is also improved. Moreover, the hydrophilic resin can be crosslinked and cured so that a lithographic printing plate precursor for which no development treatment is required is obtained.

Preferred examples of the hydrophilic resin include resin having a hydrophilic group such as a hydroxyl, carboxyl, hydroxylethyl, hydroxylpropyl, amino, aminoethyl, aminopropyl, or carboxylmethyl group; and hydrophilic sol-gel convertible binder resin. Specific examples of the hydrophilic resin are the same as described as examples of the hydrophilic resin used as the hydrophilic polymer matrix (J) which is used in the photo polymer type photosensitive layer. In the processless type thermosensitive layer, it is preferred to use the sol-gel convertible binder resin among the hydrophilic resins.

It is necessary to add a photothermal conversion material to the processless type thermosensitive layer. The photothermal conversion material may be any material which can absorb light having a wavelength of 700 nm or more. Particularly preferred are the same dyes which can absorb infrared rays as used in the above-mentioned thermal positive type.

The photosensitive layer in the invention can be provided by applying, onto a support, a solution containing the components of the photosensitive layer.

Examples of the solvent used in the coating solution include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolatone, and toluene. When using a water soluble photosensitive layer, examples of the solvent are aqueous solvents such as water and alcohols. However, the solvent is not limited to these examples, and the solvent may be appropriately selected in accordance with physical properties of the image forming layer. These solvents are used alone or in the form of a mixture thereof. The concentration of the above-mentioned respective components (all solid contents including the additives) in the solvent is preferably from 1 to 50% by mass.

The application amount (of all the solid contents) on the support after the solution is applied and dried varies depending on the use. Regarding a lithographic printing plate precursor, in general, the application amount is preferably from 0.5 to 5.0 g/m$^2$. As the application amount gets smaller, the apparent sensitivity increases, however the membrane property of the recording layer gets worse. The photosensitive composition applied on the support is usually dried at normal temperature. In order to dry within a short time, the photosensitive composition may be dried at 30 to 150° C. for 10 seconds to 10 minutes using a hot-air dryer or an infrared dryer.

The method of the application may be any one selected from various methods, including roll coating, dip coating, air knife coating, gravure coating, guravure offset coating, hopper coating, blade coating, wire doctor coating, and spray coating.

[Other Layers]

The lithographic printing plate precursor of the invention may appropriately include not only the subbing layer and the photosensitive layer but also other layers such as an overcoat layer and a back coat layer in accordance with a desired property. Preferred examples of the back coat layer include coat layers made of an organic polymer compound described in Japanese Unexamined Patent Publication (Kokai) No. 5-45885 and coat layers made of a metal oxide obtained by hydrolyzing and polycondensating an organic or inorganic metal compound, described in Japanese Unexamined Patent Publication (Kokai) No. 6-35174. Among these coat layers, particularly preferred is the coat layer made of the metal oxide obtained from an alkoxyl compound of silicon, such as $Si(OCH_3)_4$, $Si(OC_2H_5)_4$, $Si(OC_3H_7)_4$ or $Si(OC_4H_9)_4$, which is inexpensive and easily available, because the coat layer is excellent in development resistance.

<Support>

The support used in the present invention can be arbitrarily selected from materials having required properties such as strength, endurance and flexibility.

Examples of the support used include metal plates such as aluminum, zinc, copper, stainless steel, and iron plates; plastic films such as polyethylene terephthalate, polycarbonate, polyvinyl acetal, and polyethylene films; composite materials obtained by vacuum-depositing or laminating a metal layer on papers or plastic films on which a synthetic resin is melt-coated or a synthetic resin solution is coated; and materials used as the support of the printing plate. Among these supports, aluminum and composite supports coated with aluminum are preferably used.

The surface of the aluminum support is preferably subjected to surface treatment for the purpose of enhancing water retention and improving adhesion with the photosensitive layer. Examples of the surface treatment include surface roughening treatments such as brush polishing, ball polishing, electrolytic etching, chemical polishing, liquid honing, sand blasting, and a combination thereof. Among these surface treatments, a surface roughening treatment including the use of electrolytic etching is preferable.

As the electrolytic bath used in the electrolytic etching, an aqueous solution containing acid, alkali or a salt thereof, or an aqueous solution containing an organic solvent is used. Among these, an electrolytic solution containing hydrochloric acid, nitric acid, or a salt thereof is preferable.

The aluminum plate subjected to the surface roughening treatment is subjected to desmutting using an aqueous solution of an acid or alkali, if necessary. The aluminum support thus obtained is preferably subjected to an anodizing treatment. An anodizing treatment of treating using a bath containing sulfuric acid or phosphoric acid is particularly preferable.

The aluminum support is preferably subjected to a hydrophilization treatment after being subjected to the surface roughening treatment (graining treatment) and anodizing treatment. The hydrophilization treatment can be conducted by dipping of an aluminum support in hot water or a hot water solution containing an inorganic or organic salt, sealing treatment with steam bath, silicate treatment (sodium silicate, potassium silicate), potassium fluorozirconate treatment, phosphomolybdate treatment, alkyl titanate treatment, polyacrylic acid treatment, polyvinylsulfonic acid treatment, polyvinylphosphonic acid treatment, phytic acid treatment, treatment with a salt of hydrophilic organic polymer compound and divalent metal, hydrophilization treatment by undercoating with a water soluble polymer having an sulfonic acid group, coloring treatment with an acidic dye, and electrodeposition with silicate.

The lithographic printing plate precursor of the invention can be prepared as described above.

<Exposure and Development>

The lithographic printing plate precursor of the invention is imagewise exposed to light in accordance with properties of respective photosensitive layers thereof. Specific examples of the method of the exposure include light irradiation, such as irradiation of infrared ray with infrared laser, irradiation of ultraviolet ray with an ultraviolet lamp, irradiation of visible ray; electron beam irradiation such as γ-ray radiation; and thermal energy application with a thermal head, a heat roll, a heating zone using a non-contact type heater or hot wind, or the like. The lithographic printing plate precursor of the present invention can be used as a so-called computer-to-plate (CTP) plate capable of directly writing images on a plate, using a laser, based on digital image information from a computer. It is also possible to write images by a method using as a GLV (Grafting Light Valve) or a DMD (Digital Mirror Device) as digital image writing means.

As a light source laser for exposure of the lithographic printing plate precursor of the present invention, a high-output laser having a maximum intensity within the near infrared or the infrared range is used most preferably. Examples of the high-output laser having a maximum intensity within a near infrared or infrared range include various lasers having a maximum intensity within a near infrared or infrared range of 760 to 3000 nm, for example, semiconductor laser and YAG laser. If necessary, a development treatment may be conducted after writing images on the photosensitive layer using laser and heat-treating in a heat oven.

The lithographic printing plate precursor of the present invention is converted into a lithographic printing plate having the image area formed thereon by writing images on the photosensitive layer using laser, followed by a development treatment and removal of the non-image area using a wet method. Water or an aqueous developer can be used as the developer for development treatment.

An aqueous alkali solution having the pH of 12 or higher is usually used as the aqueous developer.

Examples of the alkali agent used in the developer include inorganic alkali compounds such as sodium silicate, potassium silicate, potassium hydroxide, sodium hydroxide, lithium hydroxide, sodium, potassium or ammonium salts of secondary or tertiary phosphoric acid, sodium metasilicate, sodium carbonate, and ammonia; and organic alkali compounds such as monomethylamine, dimethylamine, trimethylamide, monoethylamine, diethylamine, triethylamine, monoisopropylamine, diisopropylamine, triisopropylamine, n-butylamine, di-n-butylamine, monoethanolamine, diethanolamine, triethanolamine, ethyleneimine, and ethylenediamine.

The content of the alkali agent in the developer is preferably within a range from 0.005 to 10% by mass, and particularly preferably from 0.05 to 5% by mass. The content of the alkali agent in the developer of less than 0.005% by mass is not preferable because the development may not be conducted sufficiently. The content of more than 10% by mass is not preferable because an adverse influence such as corrosion of the image portion is exerted on development.

An organic solvent can also be added to the developer. Examples of the organic solvent, which can be added to the developer, include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methylphenyl carbitol, n-amyl alcohol, methylamyl alcohol, xylene, methylene dichloride, ethylene dichloride, and monochlorobenzene. When the organic solvent is added to the developer, the content of the organic solvent is preferably 20% by mass or less, and particularly preferably 10% by mass or less.

If necessary, it is also possible to add, to the developer, water soluble sulfites such as lithium sulfite, sodium sulfite, potassium sulfite, and magnesium sulfite; hydroxyaromatic compounds such as an alkali soluble pyrazolone compound, an alkali soluble thiol compound, and methyl resorcin; water softeners such as polyphosphate and aminopolycarboxylic acids; various surfactants, for example, anionic, cationic, amphoteric and fluorine-based surfactants such as sodium isopropylnaphthalenesulfonate, sodium n-butylnaphthalenesulfonate, sodium N-methyl-N-pentadecylaminoacetate, and sodium lauryl sulfate; and various defoamers. Furthermore, the developer may contain colorants, plasticizers, chelating agents, and stabilizers.

As the developer, commercially available developers for negative or positive type PS plate can be used. Specifically, a solution prepared by diluting a commercially available concentrated developer for negative or positive type PS plate 1 to 1000 times can be used as the developer in the present invention.

The processless type lithographic printing plate precursor of the present invention can be developed with water according to characteristics of the photosensitive layer. Therefore, after writing images on the photosensitive layer using laser and mounting to a printing machine without being subjecting to a conventional development treatment with a strong alkali developer, dampening water is fed to the lithographic printing plate on the printing machine, thus making it possible to develop with the dampening water.

The temperature of the developer is preferably within a range from 5 to 90° C., and particularly preferably from 10 to 50° C. The dipping time is preferably within a range from 1 second to 5 minutes. If necessary, the surface can be slightly rubbed during the development.

After the completion of the development treatment, the lithographic printing plate is washed with water and/or subjected to a treatment with an aqueous desensitizing agent. Examples of the aqueous desensitizing agent include aqueous solutions of water soluble natural polymers such as gum arabic, dextrin, and carboxymethylcellulose, and aqueous solutions of water soluble synthetic polymers such as polyvinyl alcohol, polyvinyl pyrrolidone, and polyacrylic acid. If necessary, acids or surfactants are added to these aqueous desensitizing agents. After subjecting to a treatment with the desensitizing agent, the lithographic printing plate is dried and then used for printing as a printing plate.

Rigid images can be obtained by a heat treatment after development. The heat treatment is preferably conducted at a temperature within a range from 70 to 300° C. Preferable heating time varies depending on the heating temperature and is from about 10 seconds to 30 minutes.

As described above, the lithographic printing plate precursor of the present invention is capable of recording images by scanning exposure based on digital signals, and the recorded images can be developed with water or an aqueous developer. Alternatively, printing can be conducted by mounting the printing plate to a printing machine without being subjected to a development treatment.

EXAMPLES

The present invention will now be described by way of examples, but the present invention is not limited to the scope of the following examples.

Synthesis Example 1

Step 1

In a 200 milliliter reaction vessel equipped with a reflux condenser, a thermometer, a dropping device and a stirrer, 25.0 g of a copolymer GSM-601 (Gifu Shellac Mfg., Co., Ltd.: monomer ratio, maleic anhydride/styrene=40/60, Mwt=5,500) of maleic anhydride and 75.0 g of dimethylacetamide were introduced. After heating to 80° C., a solution mixture of 10.0 g of N,N-dimethylaminopropylamine and 15.0 g of dimethylacetamide was added in the reaction vessel. After the completion of dropwise addition, the inner temperature was maintained at 80° C. for 30 minutes to obtain a maleamic acid copolymer. After the completion of the reaction, a small amount of a sample was collected and solubility in ethyl acetate or water was examined. As a result, the maleamic acid copolymer was not dissolved in ethyl acetate nor water.

Step 2

After the completion of the reaction of the step 1, the reaction mixture was heated and a solution mixture of 12.0 g of bromopropane and 15.0 g of dimethylacetamide was added dropwise at 80° C. into the reaction mixture of the step 1. After the completion of dropwise addition, the reaction was conducted at 110° C. for one hour. After the completion of the reaction, the reaction mixture was cooled to room temperature. The reaction mixture was dissolved in water, but was not dissolved in ethyl acetate.

Step 3

The reaction mixture was poured into 1 liter of ethyl acetate, thereby to solidify and precipitate the objective product. The resulting solid was collected by filtration and then dried to obtain 45.1 g (yield: 96%) of a maleamic acid copolymer in which a hydrogen atom on a nitrogen atom is substituted with an onium group.

Synthesis Examples 2 TO 19

In the same manner as in Synthesis Example 1, onium N-substituted maleamic acid copolymers, in which a hydrogen atom on a nitrogen atom is substituted with an onium group, was obtained from various maleic anhydride copolymers. The results are shown in Table 1.

[Table 1]

TABLE 1

Synthesis Example of maleamic acid copolymer in which a hydrogen atom on a nitrogen atom is substituted with an onium group

| | | Maleic anhydride copolymer | | | | Onium N-substituted maleamic acid copolymer | | |
| --- | --- | --- | --- | --- | --- | --- | --- | --- |
| | | Maan | Sty | αMSty | AN | Mwt | Yield (%) | Solubility |
| Synthesis Example 2 | RV-89 | 25 | 75 | | | 6000 | 86 | WS |
| Synthesis Example 3 | RV-11 | 20 | 80 | | | 8000 | 70 | WS/WD |

TABLE 1-continued

Synthesis Example of maleamic acid copolymer in which a hydrogen atom on a nitrogen atom is substituted with an onium group

| | | Maleic anhydride copolymer | | | | Onium N-substituted maleamic acid copolymer | | |
|---|---|---|---|---|---|---|---|---|
| | | Maan | Sty | αMSty | AN | Mwt | Yield (%) | Solubility |
| Synthesis Example 4 | RV-12 | 20 | 40 | | 40 | 6000 | 68 | WD |
| Synthesis Example 5 | RV-13 | 20 | 50 | | 30 | 8000 | 72 | WS |
| Synthesis Example 6 | RV-14 | 20 | 60 | | 20 | 8000 | 70 | WS |
| Synthesis Example 7 | RV-11 | 20 | 80 | | | 8000 | 40 | WS |
| Synthesis Example 8 | RV-89 | 25 | 75 | | | 6000 | 61 | WS |
| Synthesis Example 9 | AAP-31 | 10 | 90 | | | 10800 | 33 | WS |
| Synthesis Example 10 | RV-32 | 15 | 55 | | 30 | 8000 | 68 | WS |
| Synthesis Example 11 | RV-33 | 20 | | 50 | 30 | 8000 | 88 | WS |
| Synthesis Example 12 | RV-34 | 15 | | 55 | 30 | 8000 | 35 | WS |
| Synthesis Example 13 | RV-32 | 15 | 55 | | 30 | 8000 | 60 | WS |
| Synthesis Example 14 | RV-32 | 15 | 55 | | 30 | 8000 | 67 | WS |
| Synthesis Example 15 | RV-32 | 15 | 55 | | 30 | 8000 | 41 | WD |
| Synthesis Example 16 | RV-12 | 20 | 40 | | 40 | 6000 | 72 | WD |
| Synthesis Example 17 | GSM-601 | 40 | 60 | | | 5500 | 96 | WS |
| Synthesis Example 18 | GSM-10001 | 40 | 60 | | | 98000 | 98 | WS |
| Synthesis Example 19 | GSM-1001 | 40 | 60 | | | 9000 | 98 | WS |

Remarks:
Maan = maleic anhydride
Sty = styrene
αMSty = alpha methylstyrene
AN = acrylonitrile
RV-, GSM- = trade name of maleic anhydride copolymer manufactured by Gifu Shellac Mfg., Co., Ltd.
AAP = maleic anhydride copolymer synthesized in a laboratory
WS = water solubility
WD = water dispersibility

Synthesis Example 20

In a 200 ml flask equipped with a reflux condenser, a thermometer, a dropping device, a stirrer and a gas inlet, 3.75 g of a maleic anhydride monomer, 13.75 g of a styrene monomer, 7.5 g of an acrylonitrile monomer and 75.0 g of dimethylacetamide were introduced. After passing nitrogen gas for one hour and heating to 80° C., 0.2 g of 2,2'-azobisisobutyronitrile (AIBN) was added. While adding 0.2 g of AIBN every 30 minutes, the reaction was conducted for 3 hours. After the completion of the reaction, the reaction mixture was cooled and the viscosity of the reaction mixture was measured. As a result, it was VIS A (gardener viscosity indication: 25° C.). The reaction mixture was soluble in ethyl acetate, but was insoluble in water.

While maintaining at 80° C. without taking out the reaction mixture from the vessel, a solution mixture of 3.75 g of N,N-dimethylaminopropylamine and 15.0 g of dimethylacetamide was added dropwise. After the completion of dropwise addition, the reaction was continued at 80° C. for 30 minutes. A portion of the reaction sample was taken out and the solubility was examined. As a result, it was not dissolved in ethyl acetate and water.

Subsequently, a solution mixture of 4.5 g of bromopropane and 15 g of dimethylacetamide was added dropwise at 80° C. After the completion of dropwise addition, the reaction was conducted at 110° C. for one hour. The reaction solution became soluble in water, but was insoluble in ethyl acetate.

After the completion of the reaction, the reaction mixture was cooled and then poured into 1 liter of ethyl acetate while stirring, thereby to solidify and precipitate the objective product. The yield was 22.6 g (68%).

As described above, the maleamic acid copolymer, in which a hydrogen atom on a nitrogen atom is substituted with an onium group, can be synthesized by continuously reacting a monomer, which is a material of a copolymer, as a starting material without taking out an intermediate using only one vessel.

Examples 1-5 and Comparative Examples 1-5

An aqueous 0.5% by weight solution of the maleamic acid copolymer in which a hydrogen atom on a nitrogen atom is substituted with an onium group synthesized in Synthesis Example 1 was applied on an aluminum substrate subjected to a silicate treatment and an aluminum substrate subjecting to an anodizing treatment after electrograining to form a subbing layer, and then photosensitive layers A-E were formed on both substrates (Examples 1-5). In the same manner as in Examples 1-5, except that no subbing layer was formed, photosensitive layers A-E were formed on both substrates (Comparative Example 1-5). Examples 1-5 and Comparative Examples 1-5 will now described in detail.

Example 1

A photosensitive coating solution A having the following composition was prepared.
[Table 2]

TABLE 2

Composition of photosensitive coating solution A

| Components | Amount (g) |
|---|---|
| Ester compound of 1,2-naphthoquinonediazide-5-sulfonic acid chloride and 2,3,4-trihydroxybenzophenone | 0.2 |
| Condensation compound (weight-average molecular weight: 6,000) of m/p-cresol (ratio m/p is 6/4) and formaldehyde | 0.78 |
| 2-(4-methoxynaphthyl)-4,6-bis(trichloromethyl)-S-triazine | 0.01 |
| Victoria Pure Blue BOH (manufactured by Hodogaya Chemical Co., Ltd.) | 0.01 |
| Methyl ethyl ketone | 5.00 |
| Ethylene glycol monomethyl ether | 5.00 |

Using a bar coater with a rod number 12, the photosensitive coating solution A was applied on each of the silicate-treated aluminum substrate and the anodized aluminum substrate, each having a subbing layer formed thereon, and then dried at 110° C. for 3 minutes to obtain two kinds of positive type lithographic printing plate precursors (with different substrates) comprising a subbing layer and a photosensitive layer A.

Comparative Example 1

The photosensitive coating solution A was applied on each of the silicate-treated aluminum substrate and the anodized aluminum substrate, each having no subbing layer formed thereon, and then dried at 110° C. for 3 minutes to obtain two kinds of positive type lithographic printing plate precursors (with different substrates) comprising only a photosensitive layer A.

In both lithographic printing plate precursors of Example 1 and Comparative Example 1, the amount of a dry coating film of the photosensitive layer A was 2.0 g/m². A gray scale (difference in optical density: 0.15) was vacuum-contacted with the resulting lithographic printing plate precursor, which was then exposed from the distance of 1 m at 20 counts using a 3 kW metal halide lamp. Using a developer prepared by diluting a PD1 developing stock solution (manufactured by Kodak Polychrome Graphics Japan Ltd.) with water 9 times, a development treatment was conducted by an automatic processor PD-912 manufactured by Dainippon Screen Mfg. Co., Ltd. at 30° C. for 12 seconds to obtain a lithographic printing plate.

Example 2

A photosensitive coating solution B having the following composition was prepared.
[Table 3]

TABLE 3

Composition of photosensitive coating solution B

| Components | Amount (g) |
|---|---|
| Ethylene glycol monomethyl ether | 450.0 |
| Methyl ethyl ketone | 450.0 |
| Resole resin GP 649D99 (manufactured by Georgia-Pacific Corporation) | 35.0 |
| Condensate (weight-average molecular weight: 12,000) of m-cresol and formaldehyde | 50.0 |
| 3-diazo-4-methoxydiphenylamine trifluoromethanesulfonate | 6.0 |
| Cyanine dye A | 6.0 |
| Cyanine dye B | 2.0 |
| D-11 (manufactured by PCAS Co.) | 1.0 |
| DC190 (manufactured by Dow Corning Co.) | 0.6 |

Cyanine dye A =
[Chemical Formula 7]

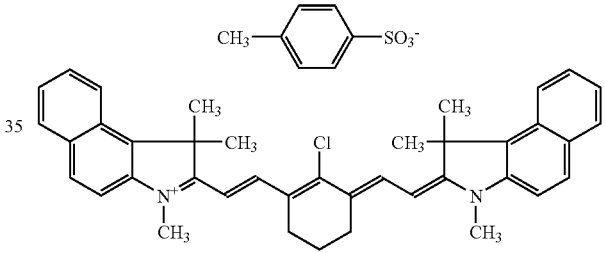

Cyanine dye B =
[Chemical Formula 8]

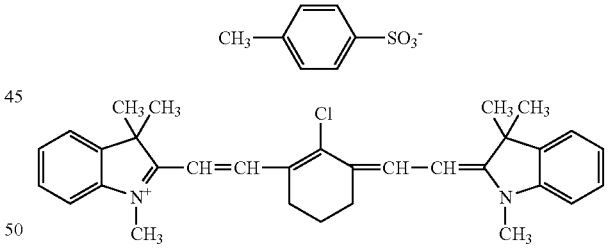

D-11 =
[Chemical Formula 9]

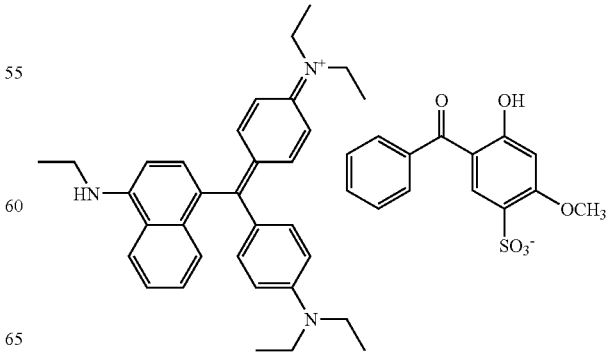

Using a bar coater with a rod number 8, the photosensitive coating solution B was applied on each of the silicate-treated aluminum substrate and the anodized aluminum substrate, each having a subbing layer formed thereon, and then dried at 110° C. for 40 seconds to obtain two kinds of positive type lithographic printing plate precursors (with different substrates) comprising only a subbing layer and a photosensitive layer B.

Comparative Example 2

The photosensitive coating solution B was applied on each of the silicate-treated aluminum substrate and the anodized aluminum substrate, each having no subbing layer formed thereon, and then dried at 110° C. for 40 seconds to obtain two kinds of positive type lithographic printing plate precursors (with different substrates) comprising only a photosensitive layer B.

In both lithographic printing plate precursors of Example 2 and Comparative Example 2, the amount of a dry coating film of the photosensitive layer B was 1.50 g/m². A gray scale (difference in optical density: 0.15) was vacuum-contacted with the resulting lithographic printing plate precursor, which was then exposed from the distance of 1 m at 20 counts using a 3 kW metal halide lamp. Using a developer prepared by diluting a PD1 developing stock solution (manufactured by Kodak Polychrome Graphics Japan Ltd.) with water 28 times, a development treatment was conducted by an automatic processor PD-912 manufactured by Dainippon Screen Mfg. Co., Ltd. at 30° C. for 12 seconds to obtain a lithographic printing plate.

Example 3

A photosensitive coating solution C having the following composition was prepared.
[Table 4]

TABLE 4

Composition of photosensitive coating solution C

| Components | Amount (g) |
| --- | --- |
| Methyl N-methacryloyl carbamate copolymer | 10.0 |
| 4-dodecylbenzenesulfonate of condensate of 4-diazophenylamine and paraformaldehyde | 2.0 |
| Malic acid | 0.1 |
| Victoria Pure Blue BOH (manufactured by Hodogaya Chemical Co., Ltd.) | 0.2 |
| Ethylene glycol monomethyl ether | 200 |

Methyl N-methcryloylcarbamate copolymer is a resin having a weight-average molecular weight of 24000 (24,000) obtained by copolymerizing at a monomer composition (weight) ratio, methyl N-methcryloylcarbamate/methyl methacrylate/acrylonitrile=10/7/8.

Using a bar coater with a rod number 12, the photosensitive coating solution C having the above composition was applied on each of the silicate-treated aluminum substrate and the anodized aluminum substrate, each having a subbing layer formed thereon, and then dried at 100° C. for 40 seconds to obtain two kinds of negative type lithographic printing plate precursors (with different substrates) comprising a subbing layer and a photosensitive layer C.

Comparative Example 3

The photosensitive coating solution C was applied on each of the silicate-treated aluminum substrate and the anodized aluminum substrate, each having no subbing layer formed thereon, and then dried at 100° C. for 40 seconds to obtain two kinds of negative type lithographic printing plate precursors (with different substrates) comprising only a photosensitive layer C.

In both lithographic printing plate precursors of Example 3 and Comparative Example 3, the amount of a dry coating film of the photosensitive layer C was 2.0 g/m². A gray scale (difference in optical density: 0.15) was vacuum-contacted with the resulting lithographic printing plate precursor, which was then exposed from the distance of 1 m at 32 counts using a 3 kW metal halide lamp. Using a developer prepared by diluting an ND1 developing stock solution (manufactured by Kodak Polychrome Graphics Japan Ltd.) with water 9 times, a development treatment was conducted by an automatic processor PD-912 manufactured by Dainippon Screen Mfg. Co., Ltd. at 30° C. for 12 seconds to obtain a lithographic printing plate.

Example 4

A photosensitive coating solution D having the following composition was prepared.
[Table 5]

TABLE 5

Composition of photosensitive coating solution D

| Components | Amount (g) |
| --- | --- |
| Binder resin | 4.8 |
| Onium salt | 0.9 |
| Dipentaerythritol hexaacrylate | 3.0 |
| Organic borate initiator | 0.6 |
| Infrared absorber | 0.2 |
| DC190 (manufactured by Dow Corning Co.) | 0.06 |
| Crystal Violet (manufactured by Hodogaya Chemical Co., Ltd.) | 0.3 |
| Ethylene glycol monomethyl ether | 70.0 |
| Methyl ethyl ketone | 20.0 |

Binder resin =
[Chemical Formula 10]

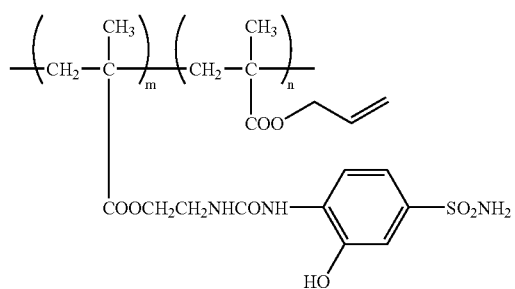

TABLE 5-continued

Onium salt =
[Chemical Formula 11]

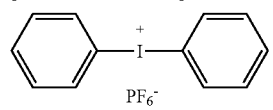

Organic borate initiator =
[Chemical Formula 12]

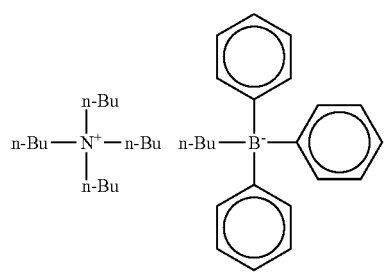

Infrared absorber =
[Chemical Formula 13]

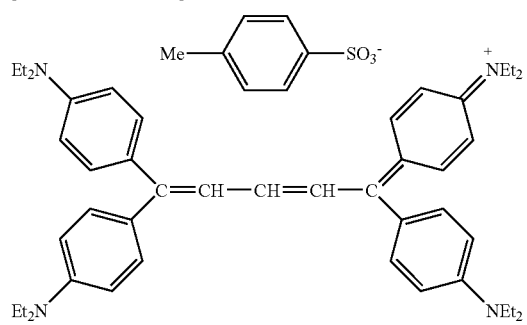

Using a bar coater with a rod number 12, the photosensitive coating solution D having the above composition was applied on each of the silicate-treated aluminum substrate and the anodized aluminum substrate, each having a subbing layer formed thereon, and then dried at 110° C. for 30 seconds to obtain two kinds of photopolymer type lithographic printing plate precursors (with different substrates) comprising a subbing layer and a photosensitive layer D.

Comparative Example 4

The photosensitive coating solution D was applied on each of the silicate-treated aluminum substrate and the anodized aluminum substrate, each having no subbing layer formed thereon, and then dried at 110° C. for 30 seconds to obtain two kinds of photopolymer type lithographic printing plate precursors (with different substrates) comprising only a photosensitive layer D.

In both lithographic printing plate precursors of Example 4 and Comparative Example 4, the amount of a dry coating film of the photosensitive layer D was 2.0 g/m². The resulting photosensitive lithographic printing plate precursor was imagewise-exposed by Trendsetter 3244 (manufactured by CREO Corp.) under the conditions of 10 W and 150 rpm, and then developed with a TCD-900 developing stock solution (manufactured by Kodak Polychrome Graphics Japan Ltd.) by an automatic processor PD-912 manufactured by Dainippon Screen Mfg. Co., Ltd. at 27° C. for 15 seconds to obtain a lithographic printing plate.

Example 5

A photosensitive coating solution E having the following composition was prepared.
[Table 6]

TABLE 6

Composition of photosensitive coating solution E

| Components | Amount (g) |
|---|---|
| Binder resin | 1.0 |
| Aqueous 18% ammonia solution | 0.5 |
| Ethanol | 2.5 |
| Cyanine dye A | 0.1 |
| DC190 (manufactured by Dow Corning Co.) | 0.02 |
| Crystal Violet (manufactured by Hodogaya Chemical Co., Ltd.) | 0.01 |
| Distilled water | 9.0 |

Cyanine dye A is shown in [Chemical Formula 7] and a binder resin is shown in [Chemical Formula 10].

Using a bar coater with a rod number 12, the photosensitive coating solution E having the above composition was applied on each of the silicate-treated aluminum substrate and the anodized aluminum substrate, each having a subbing layer formed thereon, and then dried at 80° C. for 60 seconds to obtain two kinds of photopolymer type lithographic printing plate precursors (with different substrates) comprising a subbing layer and a photosensitive layer E.

Comparative Example 5

The photosensitive coating solution E was applied on each of the silicate-treated aluminum substrate and the anodized aluminum substrate, each having no subbing layer formed thereon, and then dried at 80° C. for 60 seconds to obtain two kinds of photopolymer type lithographic printing plate precursors (with different substrates) comprising only a photosensitive layer E.

In both lithographic printing plate precursors of Example 5 and Comparative Example 5, the amount of a dry coating film of the photosensitive layer E was 2.0 g/m². The resulting photosensitive lithographic printing plate precursor was imagewise-exposed by Trendsetter 3244 (manufactured by CREO Corp.) under the conditions of 8.5 w and 180 rpm, and then developed with a TCD-500 developing stock solution (manufactured by Kodak Polychrome Graphics Japan Ltd.) by an automatic processor PD-912 manufactured by Dainippon Screen Mfg. Co., Ltd. at 27° C. for 20 seconds to obtain a lithographic printing plate.

The lithographic printing plates obtained in Examples 1-5 and Comparative Examples 1-5 were subjected to an ink stain test. That is, each of the resulting printing plates was inked (GEOS-G, Beni, N; manufactured by Dainippon Ink and Chemicals, Incorporated) using a roller and then allowed to stand for 15 minutes. When the inked printing plate was slightly rubbed with a piece of inked cloth in water, the ink of the non-image area is removed in the printing plate, which is excellent in hydrophilicity of the subbing layer, and thus clear images were obtained. When hydrophilicity is poor, the ink was remained on the non-image area and ink stains generated. The results are rated as follows: 5: excellent, 4: good, 3: fair, 2: failure, and 1: poor. The results are shown in Table 7.

[Table 7]

TABLE 7

Subbing layer effect in lithographic printing plate

| | Subbing layer | Photosensitive layer | Developing conditions | | | | Results of ink stains | |
| | | | Developing stock solution | Dilution ratio | Temperature | Time | Silicate-treated substrate | Anodized substrate |
|---|---|---|---|---|---|---|---|---|
| Example 1 | formed | A | PD1 | 1/9 | 30° C. | 12 sec | 4 | 5 |
| Example 2 | formed | B | PD1 | 1/28 | 30° C. | 12 sec | 4 | 5 |
| Example 3 | formed | C | ND1 | 1/9 | 30° C. | 12 sec | 4 | 5 |
| Example 4 | formed | D | TCD-900 | Stock solution | 27° C. | 15 sec | 4 | 5 |
| Example 5 | formed | E | TCD-500 | 1/2 | 27° C. | 20 sec | 4 | 5 |
| Comparative Example 1 | not formed | A | PD1 | 1/9 | 30° C. | 12 sec | 2 | 3 |
| Comparative Example 2 | not formed | B | PD1 | 1/28 | 30° C. | 12 sec | 3 | 2 |
| Comparative Example 3 | not formed | C | ND1 | 1/9 | 30° C. | 12 sec | 3 | 2 |
| Comparative Example 4 | not formed | D | TCD-900 | Stock solution | 27° C. | 15 sec | 3 | 3 |
| Comparative Example 5 | not formed | E | TCD-500 | 1/2 | 27° C. | 20 sec | 2 | 3 |

In the lithographic printing plates having a subbing layer of Examples 1-5, good effects were exerted as compared with the lithographic printing plates having no subbing layer of Comparative Examples 1-5.

Example 6, 7 and Comparative Examples 6, 7

Using a No. 12 rod bar, an aqueous 0.5% by weight solution of the maleamic acid copolymer in which a hydrogen atom on a nitrogen atom is substituted with an onium group synthesized in Synthesis Example 1 was applied on an aluminum substrate subjected to a silicate treatment and an anodizing treatment after electrograining, respectively. The coating solution was dried at 80° C. for 60 seconds to form a subbing layer. Using a No. 12 rod bar, the photosensitive coating solution A was applied on a substrate having a subbing layer formed thereon and then dried at 100° C. for 40 seconds to obtain printing plate precursors of Examples 6 and 7. The application amount was 1.8 g/m².

Using a No. 12 rod bar, the photosensitive coating solution A was directly applied on each of the silicate-treated aluminum substrate and the anodized aluminum substrate, and then dried at 100° C. for 40 seconds to obtain lithographic printing plate precursors (Comparative Examples 6 and 7). The application amount of the photosensitive layer in Comparative Examples 6 and 7 was 1.8 g/m².

The resulting lithographic printing plate precursors of Examples 6, 7 and Comparative Examples 6, 7 were exposed through an Ugura's standard film at 20 counts by a printer HIIQ-MARK II (manufactured by Dainippon Screen Mfg. Co., Ltd.) and then developed with a solution prepared by diluting a PD1 developer (manufactured by Dainippon Ink and Chemicals, Incorporated) at a ratio 1:8 at a temperature of 30° C. while changing a development time to obtain printing plates. The printing plate was valuated as follows. With respect to the image area, judgment was conducted by a 2% dot portion as a standard. With respect to the non-image area, judgment was conducted by measuring the optical density. The results are shown in Table 3.

[Table 8]

TABLE 8

Subbing layer effect in printing plate coated with photosensitive coating solution A

| | Substrate | Subbing layer | Developoing time (seconds) | | | | |
| | | | 15 | 20 | 25 | 30 | 35 |
|---|---|---|---|---|---|---|---|
| Example 6 | silicate-treated | formed | G/P | G/G | G/G | G/G | P/G |
| Comparative Example 6 | silicate-treated | not formed | G/P | G/P | G/P | G/P | P/G |
| Example 7 | anodized | formed | G/P | G/G | G/G | G/G | P/G |
| Comparative Example 7 | anodized | not formed | G/P | G/P | G/P | G/P | P/P |

Remarks:
The symbol ⸺ represents development latitude.
Evaluation of image area/Evaluation of non-image area
With respect to the image portion: G = good; P (poor) = deletion of 2% dot
With respect to the non-image area: G = optical density of 0.7 or less; P = optical density of 0.7 or more The printing plate precursors having a subbing layer formed thereon of Examples 6 and 7 could provide printing plates which have wide development latitude and a clearer non-image area. In the printing plate precursors having no subbing layer of Comparative Examples 6 and 7, the resulting printing plates had no development latitude and the non-image area had high optical density, and thus stains of the printing material may generate during printing.

Examples 8, 9 and Comparative Examples 8, 9

Using a No. 12 rod bar, the photosensitive coating solution E was applied on the aluminum substrates having a subbing layer formed thereon obtained in Examples 6, 7, and then dried at 80° C. for 60 seconds to obtain printing plate precursors of Examples 8, 9. The application amount was 2.0 g/m². Similarly, using a No. 12 rod bar, the photosensitive coating solution E was directly applied on the aluminum substrates having no subbing layer obtained in Comparative Examples 6, 7, and then dried at 80° C. for 60 seconds to obtain printing plate precursors of Comparative Examples 8, 9. The application amount was 2.0 g/m². The resulting printing plate precursors were subjected to an image writing treatment by Trendsetter 3244 (manufactured by CREO Corp.), and then developed with a solution prepared by diluting a TCD-500 developer (manufactured by KPG Co.) at a ratio 1:1 at a temperature of 27° C. while changing a development time to obtain printing plates. The printing plate was evaluated as follows. With respect to the image portion, judgment was conducted by a 1% dot portion as a standard. With respect to the non-image portion, judgment was conducted by an optical density of 0.7 as a standard. The results are shown in Table 4.

[Table 9]

TABLE 9

Subbing layer effect in printing plate coated with photosensitive coating solution E

| | Substrate | Subbing layer | Developoing time (seconds) | | | | | |
|---|---|---|---|---|---|---|---|---|
| | | | 5 | 10 | 15 | 20 | 25 | 30 |
| Example 8 | silicate-treated | formed | G/G | G/G | P/G | P/G | P/G | P/G |
| Comparative Example 8 | silicate-treated | not formed | G/P | G/P | G/P | G/G | G/G | P/G |
| Example 9 | anodized | formed | G/P | G/P | G/G | G/G | G/G | P/G |
| Comparative Example 9 | anodized | not formed | G/P | G/P | G/P | G/P | G/P | G/P |

Remarks:
The symbol ················· represents development latitude.
Evaluation of image area/Evaluation of non-image area
With respect to the image portion: G = good; P = deletion of 2% dot
With respect to the non-image area: G = optical density of 0.7 or less; P = optical density of 0.7 or more In case of Examples 8 and Comparative Example 8 in which the silicate-treated aluminum substrate is used, the development latitude was 5 seconds and the optical density of the non-image area during developing was equivalent. As a result a comparison between the printing plate precursor having a subbing layer and the printing plate precursor having no subbing layer, optimum developing time was different, although the evaluation results were the same.

In case of Example 9 and Comparative Example 9 in which the anodized aluminum substrate is used, the printing plate having a subbing layer (Example 9) has a clear non-image area and also has development latitude, and was excellent as compared with the printing plate having no subbing layer (Comparative Example 9).

In general, the printing plate precursor having a subbing layer is excellent in development latitude and also has a clear non-image area.

Examples 10-12, Comparative Example 10

The effect of the subbing layer of the maleamic acid copolymer in which a hydrogen atom on a nitrogen atom is substituted with an onium group obtained in Synthesis Examples 17 and 18 as well as Synthesis Example 20 was examined.

An aqueous 0.1% by weight solution of each copolymer was prepared, applied on an aluminum substrate anodized after electrograining using a rod bar of No. 12, and then dried at 80° C. for 60 seconds to obtain a subbing layer. Using a rod bar of No. 12, a heat-sensitive layer for non-heating type CTP plate was applied on a substrate having a subbing layer formed thereon and then dried at 80° C. for 60 seconds to obtain printing plate precursors of Examples 10-12. The application amount was 2.0 g/m².

In Comparative Example 10, a printing plate precursor produced by the same manner as in Example 10, except for using no subbing layer, was used.

The resulting printing plate precursors of Examples 10-12 and Comparative Example 10 were subjected to an image writing treatment by Trendsetter 3244 (manufactured by CREO Corp.), and then developed with a solution prepared by diluting a TCD-500 developer (manufactured by KPG Co.) at a ratio 1:1 at a temperature of 27° C. while changing a development time to obtain printing plates. The printing plate was evaluated as follows. With respect to the image portion, judgment was conducted by a 1% dot portion as a standard. With respect to the non-image area, judgment was conducted by an optical density of 0.7 as a standard. The results are shown in Table 5.

[Table 10]

TABLE 10

Effect of various subbing layers

| | Subbing layer | Developoing time (seconds) | | | | |
|---|---|---|---|---|---|---|
| | | 10 | 15 | 20 | 25 | 30 |
| Example 10 | Synthesis Example 17 | G/P | G/G | G/G | G/G | P/G |
| Example 11 | Synthesis Example 18 | G/P | G/P | G/G | G/G | P/G |
| Example 12 | Synthesis Example 20 | G/P | G/P | G/P | G/G | P/G |
| Comparative Example 10 | not formed | G/P | G/P | G/P | G/P | G/P |

Remarks:
The symbol ················· represents development latitude.
Evaluation of image area/Evaluation of non-image area
With respect to the image area: G = good; P = deletion of 2% dot
With respect to the non-image area: G = optical density of 0.7 or less; P = optical density of 0.7 or more It has been found that all printing plate precursor having a subbing layer formed thereon by using various maleamic acid copolymer in which a hydrogen atom on a nitrogen atom is substituted with an onium group are excellent in development latitude and clearness of the non-image area as compared with the printing plate precursor having no subbing layer.

The invention claimed is:

1. A lithographic printing plate precursor comprising a support and a photosensitive layer, said lithographic printing plate precursor further comprising a subbing layer between said photosensitive layer and said support, said subbing layer containing a maleamic acid (co)polymer, in which at least one hydrogen atom on a nitrogen atom is substituted with an onium group, wherein said maleamic acid (co)polymer contains a recurring unit of the following formula Chemical Formula 1:

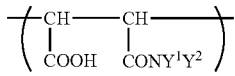

wherein $Y^1$ represents an onium group having the following Chemical Formula 2:

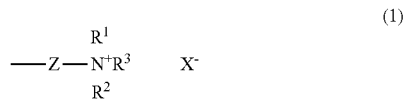

(1)

wherein:
$R^1$ and $R^2$ each independently represents a $C_1$-$C_4$ alkyl group;
$R^3$ represents a hydrogen atom or a $C_1$-$C_4$ alkyl group;
$X^-$ represents a counter anion; and
Z represents a divalent organic group), and
$Y^2$ represents a hydrogen atom or an onium group as defined above.

2. The lithographic printing plate precursor of claim 1 wherein said onium group comprises a positive nitrogen, phosphorus, or sulfur atom.

3. The lithographic printing plate precursor of claim 1 wherein said maleamic acid (co)polymer comprises a carboxyl group and a carbamoyl group bonded to two adjacent carbon atoms in the main chain.

4. The lithographic printing plate precursor of claim 1, wherein said maleamic acid (co)polymer is obtained by a first step of reacting a maleic anhydride (co)polymer with an N,N-dialkylamino group-containing amine to obtain a maleamic acid (co)polymer, and a second step of reacting the resulting maleamic acid (co)polymer with an alkyl halide, an alkyl sulfonate ester, or an acid compound.

5. The lithographic printing plate precursor of claim 4, wherein said N,N-dialkylamino group-containing amine is N,N-di $C_1$-$C_4$ alkylamino $C_1$-$C_4$ alkylamine.

6. The lithographic printing plate precursor of claim 4, wherein the first and second steps are conducted successively or simultaneously.

7. The lithographic printing plate precursor of claim 4, wherein said maleic anhydride (co)polymer is a copolymer obtained by copolymerizing maleic anhydride with at least one vinyl-based monomer selected from the group consisting of ethylene, propylene, styrene, α-methylstyrene, and acrylonitrile.

8. The lithographic printing plate precursor of claim 1 wherein said maleic anhydride (co)polymer is present in said subbing layer in an amount of 50% by mass or more.

9. The lithographic printing plate precursor of claim 1 wherein said maleic anhydride (co)polymer is present in said subbing layer in an amount of from 70% to 100% by mass.

10. The lithographic printing plate precursor of claim 1 wherein said photosensitive layer is a positive type photosensitive layer.

11. The lithographic printing plate precursor of claim 1 wherein said photosensitive layer is a negative type photosensitive layer.

12. The lithographic printing plate precursor of claim 1 further comprising a photothermal conversional material.

13. The lithographic printing plate precursor of claim 11 wherein said photothermal conversional material is a pigment or dye having a sensitivity to infrared radiation.

14. The lithographic printing plate precursor of claim 1 that is developable on a printing press.

15. A method of forming an image comprising:
A) imagewise exposing the lithographic printing plate precursor of claim 1 to provide an imagewise exposed element, and
B) developing said imagewise exposed element.

16. The method of claim 15 wherein imagewise exposure is carried out using an infrared radiation laser.

17. The method of claim 15 wherein said developing is carried out using water or a developer.

18. The method of claim 15 wherein said developing is carried out on a printing press using dampening water.

* * * * *